US006593059B2

(12) United States Patent
Kawamura et al.

(10) Patent No.: US 6,593,059 B2
(45) Date of Patent: Jul. 15, 2003

(54) PLANOGRAPHIC PRINTING PLATE PRECURSOR

(75) Inventors: Koichi Kawamura, Shizuoka-ken (JP); Miki Takahashi, Shizuoka-ken (JP); Sumiaki Yamasaki, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 10/046,576

(22) Filed: Jan. 16, 2002

(65) Prior Publication Data

US 2002/0142247 A1 Oct. 3, 2002

(30) Foreign Application Priority Data

Feb. 15, 2001 (JP) ....................................... 2001-038840

(51) Int. Cl.[7] ................................................ G03F 7/038

(52) U.S. Cl. ................................ 430/270.1; 430/271.1; 430/302; 430/348; 430/944; 430/945; 101/453; 101/465

(58) Field of Search ........................... 430/270.1, 271.1, 430/302, 348, 944, 945, 964; 101/453, 463.1, 465, 466, 467

(56) References Cited

U.S. PATENT DOCUMENTS

| | | | | | |
|---|---|---|---|---|---|
| 5,807,659 | A | * | 9/1998 | Nishimiya et al. | 430/302 |
| 6,114,089 | A | * | 9/2000 | Takita et al. | 430/278.1 |
| 6,410,202 | B1 | * | 6/2002 | Fleming et al. | 430/270.1 |
| 6,509,132 | B1 | * | 1/2003 | Oohashi et al. | 430/270.1 |
| 2001/0019760 | A1 | * | 9/2001 | Kawamura | 428/195 |
| 2002/0023565 | A1 | * | 2/2002 | Kawamura et al. | 101/453 |
| 2002/0106583 | A1 | * | 8/2002 | Kawamura et al. | 430/271.1 |
| 2002/0117066 | A1 | * | 8/2002 | Kawamura et al. | 101/462 |
| 2003/0008223 | A1 | * | 1/2003 | Kawamura et al. | 430/7 |

* cited by examiner

*Primary Examiner*—Rosemary Ashton
*Assistant Examiner*—Barbara Gilliam
(74) *Attorney, Agent, or Firm*—Burns, Doane, Swecker & Mathis, LLP

(57) ABSTRACT

Provided is a planographic printing plate precursor having the advantages of good developability in printers, high sensitivity and a long press life. On a support having a hydrophilic surface with hydrophilic graft polymer chains existing therein, formed is a thermosensitive layer containing a polymer having, in the molecule, a functional group capable of interacting with the hydrophilic graft polymer and a functional group that undergoes hydrophilicity/hydrophobicity conversion through exposure to heat, acid or radiation to fabricate the planographic printing plate precursor.

20 Claims, No Drawings

PLANOGRAPHIC PRINTING PLATE PRECURSOR

BACKGROUND OF THE INVENTION

1. Field of the Invention

The present invention relates to a negative or positive planographic printing plate precursor. Precisely, the invention relates to such a planographic printing plate precursor capable of being processed into a printing plate through scanning exposure based on digital signals. It has high sensitivity and a long press life thus providing good prints with no stain, and it can be directly set in a printer to give prints, and does not require any special development after image formation thereon.

2. Description of the Related Art

Much research is being done on printing plates for computer-to-plate systems which have made remarkable progress in recent years. For further process rationalization and solving the problem of waste treatment, for example, "development-less" planographic printing plate precursors capable of being directly set in printers and which do not require development after image formation thereon are being studied, and various methods for preparing them have been proposed.

A technique of in-printer development is known as one method of simplifying plate-making operations. This comprises putting an exposed printing plate precursor onto a cylinder of a printer and then applying dampening water and ink thereto while the cylinder is rotated to thereby remove the non-image area of the precursor. Specifically, in this method, a printing plate precursor is, after being exposed for image formation thereon, directly set in a printer, and processed in an ordinary printing manner to give prints. The planographic printing plate precursor applicable to the development system must satisfy two requirements; one is that its non-image area should be capable of being readily and completely removed through treatment with a hydrophilic component such as dampening water such that no residue is left therein, and the other is that the recording layer in its image area should not peel easily and should have good adhesiveness to the underlying support. After the recording layer has been removed from the non-image area of the processed plate through the treatment, the hydrophilic support face is exposed outside. One problem with this is that, if the exposed support face is not sufficiently hydrophilic, ink will adhere thereto and cause stains on the printed matter.

We, the present inventors previously filed a Japanese patent application No. 2000-119587 which relates to a planographic printing plate precursor that satisfies the two requirements. The planographic printing plate precursor of that invention is processable in printers, and it comprises a hydrophilic layer which contains a hydrophilic graft polymer, and a thermosensitive polymer layer whose polymer undergoes, hydrophilicity/hydrophobicity conversion when excited by some external force, for example, by application of energy thereto. The planographic printing plate precursor is processable in printers and gives high-quality images which have no stain. However, there is still room for further improvement with respect to the adhesiveness between the hydrophilic layer and the thermosensitive layer therein.

SUMMARY OF THE INVENTION

With the drawbacks of the prior art techniques described above taken into consideration, the object of the invention is to provide a planographic printing plate precursor having the advantages of good processability in printers, high sensitivity and long press life.

The polymer included in the planographic printing plate original form which we have previously proposed includes a polymer capable of undergoing a hydrophilicity/hydrophobicity conversion when same external force is applied thereto. Through our studies, we have found that when the polymer is modified by introducing thereinto a functional group capable of interacting with the graft polymer existing on the surface of the support of the precursor, then the adhesiveness between the constitutive layers can be improved to ensure satisfactory press life of the printing plate. On the basis of this finding, we have achieved the present invention.

Specifically, the planographic printing plate precursor of the invention has, on a support having a hydrophilic surface with hydrophilic graft polymer chains existing therein, a thermosensitive layer containing a polymer having, in the molecule, a functional group capable of interacting with the hydrophilic graft polymer and a functional group that undergoes hydrophilicity/hydrophobicity conversion through exposure to heat, acid or radiation.

The planographic printing plate precursor of the invention has a hydrophilic surface of a graft polymer on an aluminium substrate, and therefore has good hydrophilicity and heat insulation owing to the hydrophilic graft polymer existing on the support. Heat applied to the precursor is effectively prevented from being diffused into the aluminium support, and high-sensitivity image recording on the precursor is ensured. Due to having high hydrophilicity, the hydrophilic graft polymer on the support ensures good image formation on the processed plate with no staining in the non-image area thereof. In addition, since the recording layer of the planographic printing plate precursor of the invention contains a polymer compound having a functional group capable of forming strong bonds with the graft polymer component existing on the surface of the support, the adhesiveness between the support surface and the thermosensitive layer is greatly improved, and the press life of the plate is much enhanced.

DESCRIPTION OF THE PREFERRED EMBODIMENTS

The invention is described in detail hereinunder.

The planographic printing plate precursor of the invention has, on a support having a specific hydrophilic surface, a thermosensitive layer containing a polymer capable of interacting with the polymer that constitutes the hydrophilic surface of the support.

(A) Support Having a hydrophilic Surface with Hydrophilic Graft polymer Chains Existing Therein First described is the hydrophilic surface of the support.

A hydrophilic surface of the support is meant to indicate the existence of hydrophilic graft polymer chains on the surface of the support. Concretely, hydrophilic graft polymer chains may bond directly to the surface of the support; or a stem polymer compound having hydrophilic graft polymer chains in its side branches may be used in such a manner that the polymer compound thus having hydrophilic graft polymer chains in its side branches is bonded to the surface of the support or is disposed in the support surface through coating or coating followed by crosslinking. In the invention, the cases in which such hydrophilic graft polymer chains are directly bonded to the surface of the support is referred to as "surface graft"; and when they are introduced into the cross-linked polymer film structure, it is referred to as "cross-linked hydrophilic layer having hydrophilic graft chain introduced therein".

[Method of Forming Surface Graft]

For forming an ionic surface of a graft polymer on the support, employable is any known method. Specifically, those methods described in the *Journal of the Rubber Association of Japan*, Vol. 65, p. 604, 1992, "Surface Modification and Adhesion with Macromonomer" by Shinji Sugii, for example, may be employed. In addition, a surface-grafting polymerization method described below may also be suitably used.

[Description of Surface-Grafting Method]

The surface formed by the surface-grafting method refers to a polymer surface grafted with monomer molecules in any known manner of exposing the polymer surface to light, electronic radiation, heat or the like. The monomer may be any of those positively charged with ammonium, phosphonium or the like, or those having a negatively-charged acidic group or an acidic group capable of being dissociated into a negatively-charged group, such as a sulfonic acid group, a carboxyl group, a phosphoric acid group or a phosphonic acid group, or may even be a monomer having a nonionic group such as a hydroxyl group, an amido group, a sulfonamido group, an alkoxy group or a cyano group.

The surface-grafting polymerization method comprises applying an activator to the molecular chains of a polymer compound to initiate additional polymerization of the polymer compound with a different monomer, and this is for producing graft polymers. When the polymer compound to which the activator is applied forms a solid surface, the method is referred to as surface-grafting polymerization.

The surface-grafting polymerization for realizing the invention may be any known one disclosed in literature related to the art. For example, surface-grafting polymerization methods disclosed in *Novel Polymer Experimentation* 10 (edited by the Polymer Society of Japan, 1994, published by Kyoritsu Publishing, p. 135) include a method of optical graft polymerization and a method of graft polymerization through plasma irradiation. *Handbook of Adsorption Technology* (edited by Takeuchi, published by NTS in February 1999, p. 203, p. 695) discloses graft polymerization through exposure to radiation such as γ-rays or electronic rays.

Concrete methods of optical graft polymerization disclosed in JP-A No. 63-92658, No. 10-296895 and No. 11-119413 may be used in the present invention.

Apart from the above, also employable herein is a method for forming a support having a surface graft polymer, which comprises terminating the molecular chain of a polymer compound with a reactive functional group such as a trialkoxysilyl group, an isocyanate group, an amino group, a hydroxyl group or a carboxyl group, followed by coupling the terminal functional group of the polymer compound with the surface functional group of a support.

For graft polymerization through plasma irradiation graft polymerization for use herein, referred to are the above-mentioned reference and Y. Ikeda et al., *Macromolecules*, Vol. 19, p. 1804 (1986). Concretely, the surface of a polymer such as PET is subjected to plasma irradiation or exposed to electronic radiation to thereby form radicals on its surface, and thereafter the thus-activated polymer surface is reacted with a monomer having a hydrophilic functional group. This produces a graft polymer surface layer, or that is, a hydrophilic group-having polymer surface layer.

Optical graft polymerization is also disclosed in JP-A No. 53-17407 (by Kansai Paint) and No. 2000-212313 (by Dai-Nippon Ink) in addition to the above-mentioned references. Concretely, a film substrate is coated with a photopolymerizing composition, then contacted with an aqueous radical-polymerizing compound, and exposed to light to form the surface graft polymer.

(Description of Hydrophilic Monomer)

The hydrophilic monomer useful for forming hydrophilic graft polymer chains includes, for example, those positively charged by having ammonium, phosphonium or the like, and those having a negatively-charged acidic group or an acidic group capable of being dissociated into a negatively-charged group, such as a sulfonic acid group, a carboxyl group, a phosphoric acid group or a phosphonic acid group. In addition, also useful are other hydrophilic monomers having a nonionic group such as a hydroxyl group, an amido group, a sulfonamido group, an alkoxy group or a cyano group. Examples of hydrophilic monomers especially useful in the invention include: (meth)acrylic acid and its alkali metal salts and amine salts; itaconic acid and its alkali metal salts and amine salts; allylamine and its hydrohalides; 3-vinylpropionic acid and its alkali metal salts and amine salts; vinylsulfonic acid and its alkali metal salts and amine salts; vinylstyrenesulfonic acid and its alkali metal salts and amine salts; 2-sulfoethylene (meth)acrylate, 3-sulfopropylene (meth)acrylate and their alkali metal salts and amine salts; 2-acrylamide-2-methylpropanesulfonic acid and its alkali metal salts and amine salts; acid phosphoxypolyoxyethylene glycol mono(meth)acrylate, allylamine and their hydrohalides; 2-trimethylaminoethyl (meth)acrylate and its hydrogen halides; and other monomers having any of carboxyl group, sulfonic acid group, phosphoric acid group or amino group, and their salts. Also useful are 2-hydroxyethyl (meth)acrylate, (meth) acrylamide, N-monomethylol (meth)acrylamide, N-dimethylol (meth)acrylamide, N-vinylpyrrolidone, N-vinylacetamide, allylamine and their hydrogen halides; and polyoxyethylene glycol mono(meth)acrylate.

[Method of Forming Cross-Linked Hydrophilic Layer Having a Hydrophilic Graft Chain Introduced Therein]

For forming the cross-linked hydrophilic layer having a hydrophilic graft chain introduced therein in the invention, a graft polymer is first prepared according to a method generally known for graft polymer production, and it is then cross-linked. Concretely, some methods of graft polymer production are described, for example, in *Graft Polymerization and its Applications* (by Fumio Ide, 1977, published by Polymer Publishing) and *Novel Polymer Experimentation* 2, "Synthesis and Reaction of Polymer" (edited by the Polymer Society of Japan, 1995, published by Kyoritsu Publishing).

Basically, graft polymer production includes three methods: 1. A stem polymer is branched through polymerization with a grafting monomer. 2. A graft polymer is bonded to a stem polymer. 3. A stem polymer is copolymerized with a graft polymer (macromerization).

Any of these three methods are employable herein to form the intended hydrophilic surface of the support in the invention. Of those, however, especially preferred is the method 3 of "macromerization", as the production latitude is broad and the film structure is easy to control therein.

The method of macromerization for graft polymer production is described in the above-mentioned, *Novel Polymer Experimentation* 2, "Synthesis and Reaction of Polymer" (edited by the Polymer Society of Japan, 1995, published by Kyoritsu Publishing). It is also described in detail by Yuya Yamashita in *Macromonomer Chemistry and Industry* (by IPC, 1989). Concretely, for example, acrylic acid, acrylamide, 2-acrylamide-2-methylpropanesulfonic acid, N-vinylacetamide or other hydrophilic monomers such as those concretely described hereinabove for organic cross-linked hydrophilic layers are polymerized according to the methods described in the references to produce hydrophilic macromers.

Hydrophilic macromers especially favorable for the invention are those derived from carboxylic group-containing monomers such as acrylic acid or methacrylic acid; sulfonic acid macromers derived from monomers of 2-acrylamide-2-methylpropanesulfonic acid, vinylstyrene-sulfonic acid and their salts; amide macromers derived from acrylamide and methacrylamide; amide macromers derived from N-vinylcarbonamide monomers such as N-vinylacetoamide and N-vinylformamide; macromers derived from hydroxyl group-containing monomers such as hydroxyethyl methacrylate, hydroxyethyl acrylate and glycerol monomethacrylate; and macromers derived from alkoxy or ethyleneoxide group-containing monomers such as methoxyethyl acrylate, methoxypolyethylene glycol acrylate and polyethylene glycol acrylate. In addition, monomers having a polyethylene glycol chain or a polypropylene glycol chain are also favorable for the macromers for use in the invention.

Preferably, the macromers for use in the invention have a molecular weight falling between 400 and 100,000, more preferably between 1000 and 50,000, even more preferably between 1500 and 20,000. Macromers having a molecular weight of smaller than 400 will be ineffective; but those having a molecular weight of larger than 100,000 can not suitably copolymerize with the comonomer that forms the stem chain of the resulting copolymer.

One method of using the thus-produced hydrophilic macromer for forming the cross-linked hydrophilic layer having the hydrophilic graft chain introduced therein is described. The hydrophilic macromer is copolymerized with a monomer having a reactive functional group to prepare a graft copolymer, and the resulting graft copolymer is applied onto a support along with a crosslinking agent capable of reacting with the functional group of the copolymer. Then, the graft copolymer and the crosslinking agent on the support are reacted under heat to thereby cross-link the graft copolymer on the support. Alternatively, a graft polymer having a photo-crosslinkable group or a polymerizable group may be separately prepared, and applied onto a support along with the hydrophilic macromer, and the two are reacted and cross-linked on the support through exposure to light. In that manner, a cross-linked hydrophilic layer having a hydrophilic graft polymer chain introduced is formed on the support.

The thickness of the layer to form the hydrophilic surface may be suitably selected depending on the object of the invention. In general, however, it preferably falls between 0.001 μm and 10 μm, more preferably between 0.01 μm and 5 μm, most preferably between 0.1 μm and 2 μm. If the layer is too thin, the scratch resistance of the support will be poor; but if too thick, the ink repellency of the support will be not good.

The planographic printing plate precursor of the invention is fabricated by forming a thermosensitive layer on the hydrophilic surface of the support.

(B) Thermosensitive Layer

The thermosensitive layer to be applied to the planographic printing plate precursor of the invention is described below.

The thermosensitive layer of the planographic printing plate precursor of the invention contains a polymer compound which has, in the molecule, a functional group capable of interacting with the hydrophilic graft polymer existing on the hydrophilic surface of the support mentioned above, and a functional group that undergoes a hydrophilicity/hydrophobicity conversion through exposure to heat, acid or radiation (this is hereinafter referred to as a polarity-changing group).

[Functional Group Capable of Interacting with Graft Polymer]

The polymer compound to form the thermosensitive layer of the planographic printing plate precursor of the invention has a functional group capable of interacting with the hydrophilic graft polymer of the support. This is for enhancing the adhesiveness between the hydrophilic surface of the support and the thermosensitive layer. Examples of the interaction between the hydrophilic graft polymer and the thermosensitive layer-forming polymer necessary to ensure strong bonding between the two include covalent bonding, ion bonding, hydrogen bonding, polarity interaction, and Van der Waals interaction.

For increasing the sensitivity of the planographic printing plate precursor of the invention, ion bonding or hydrogen bonding is preferred for the interaction of the two polymers, as it realizes strong bonding (interaction) of the two polymers without requiring any energy such as thermal energy.

Examples of the functional group capable of interacting with the hydrophilic graft polymer are basic functional groups such as amino group, pyridyl group; quaternary ammonium groups; hydroxyl group; acidic functional groups such as carboxyl group, sulfonic acid group; and hydrogen-bonding functional groups such as amido group. Any of these may be selected for the purpose of the invention.

The type of the functional group in the graft copolymer that exists in the hydrophilic surface of the support should be taken into consideration in selecting the functional group. Specifically, the functional group should be selected in consideration of its interactivity with the graft copolymer and of the intensity of the interaction between the two polymers. For example, in case where the graft polymer has acrylic acid grafts, the functional group to be in the thermosensitive layer-forming polymer must be interactive with acrylic acid. Concretely, preferred for the functional group is any of an amino group, a pyridyl group, a quaternary ammonium group or an amido group. On the other hand, in case where the graft polymer has acrylamide grafts, the functional group to be included in the thermosensitive layer-forming polymer must be interactive with acrylamide. A specific example is a carboxyl group.

The monomer which is used in the invention in preparing the thermosensitive layer-forming polymer and which has a functional group capable of interacting with the hydrophilic graft polymer includes, for example, amino- or quaternary ammonium-containing monomers such as 2-diethylaminoethyl acrylate, 2-dimethylaminoethyl acrylate, 2-diethylaminoethyl methacrylate, 2-dimethylaminoethyl methacrylate, 2-triethylammoniumethyl acrylate, 2-trimethylammoniumethyl acrylate, 2-triethylammoniumethyl methacrylate, 2-trimethylammoniumethyl methacrylate, dimethylaminomethylstyrene, tetramethylammoniummethylstyrene, diethylaminomethylstyrene, tetraethylammoniummethylstyrene; amide monomers such as acrylamide, N-vinylpyrrolidone, N-vinylacetamide; carboxylic acid monomers such as acrylic acid, methacrylic acid; hydroxyl-containing monomers such as 2-hydroxyethyl methacrylate; and sulfonic acid monomers such as styrenesulfonic acid.

Introducing the functional group into the thermosensitive layer-forming polymer may be effected in polymerization in which the polymer is prepared, or in additional polymer reaction after the polymer has been prepared.

[Functional Group That Undergoes Hydrophilicity/Hydrophobicity Conversion Through Exposure to Heat, Acid or Radiation]

The polarity-changing group to be introduced to the thermosensitive layer-forming polymer for use in the invention includes two types: one is a functional group that undergoes hydrophobic-to-hydrophilic conversion, and the other is a functional group that undergoes hydrophilic-to-hydrophobic conversion. Examples of the polymer having any of such functional groups for use in the invention are given below.

(Polymer Having a Functional Group Which Undergoes Hydrophobic to Hydrophilic Conversion in its Side Chains)

Of the polymers having, in the side chains, a functional group that undergoes hydrophilicity/hydrophobicity conversion, those having a functional group which undergoes hydrophobic to hydrophilic conversion in the side chains include, for example, sulfonate polymers and sulfonamide polymers disclosed in JP-A No. 10-282672; and carboxylate polymers as in EP 0652483, and JP-A Nos. 6-502260 and 7-186562

Of the polymers having a functional group which undergoes hydrophobic to hydrophilic conversion in the side chains, especially preferred for use herein are secondary sulfonate polymers, tertiary carboxylate polymers, and alkoxyalkyl carboxylate polymers.

In the invention, the content of the sulfonate polymer and/or the carboxylate polymer to be used in the thermosensitive layer may fall between 5 and 99% by weight or so, preferably between 10 and 98% by weight, more preferably between 30 and 90% by weight of the total solid content of the thermosensitive layer.

(Polymer Having a Functional Group in the Side Chains Which Undergoes Hydrophilic to Hydrophobic Conversion)

Examples of the polymer having a functional group in the side chains which undergoes hydrophilic to hydrophobic conversion are polymers having an ammonium base such as those disclosed in JP-A No. 6-317899; and decarboxylating polymers having polarity converting groups of formula (1) such as sulfonylacetic acid shown in JP-A No. 2000-309174 (Application No. 11-118295).

Specifically, of the functional group which undergoes changes in polarity that may be introduced into the thermosensitive layer-forming polymer for use in the invention, the functional group which undergoes hydrophobic to hydrophilic conversion includes, for example, a sulfonate group and a carboxylate group having a specific structure; and the functional group which undergoes hydrophilic to hydrophobic conversion includes, for example, an ammonium group and a sulfonylacetic acid group.

The functional group which undergoes changes in polarity to be used in the polymer may be any of the functional group which undergoes hydrophobic to hydrophilic conversion or the functional group which undergoes hydrophilic to hydrophobic conversion. However, if the recording layer is hydrophilic before being processed for image formation thereon, the plate face may change when water drops or fingerprints attach to the layer. From the viewpoint of easy handlability of the printing plate precursor, therefore, the functional group which undergoes hydrophobic to hydrophilic conversion is preferred.

For preparing the polymer compound which forms the thermosensitive layer and which has, in the molecule, both the functional group capable of interacting with the hydrophilic graft polymer and the polarity-changing group, the functional groups may be introduced into the polymer through polymer reaction after the thermosensitive layer-forming polymer has been prepared by polymerization. In general, however, monomers having the each functional group are copolymerized to produce the thermosensitive layer-forming polymer.

(Photo-Thermal Converting Agent)

In case where the planographic printing plate precursor of the invention is processed through scanning exposure to laser rays for image formation thereon, it is desirable that the precursor contains a photo-thermal converting agent having the ability to convert optical energy to heat energy, for increasing the sensitivity and the image-forming capability of the precursor.

The photo-thermal converting agent that may be in the thermosensitive layer of the planographic printing plate precursor of the invention may be any substance capable of absorbing light such as UV rays, visible rays, IR rays and white light to convert it into heat. The photothermal converting agent is not specifically defined, therefore, any known photo-thermal converting agent may be suitably selected and used in the invention. Concrete examples include carbon black, carbon graphite; various pigments such as phthalocyanine pigments; fine metal particles such as metal powder, metal compound powder; and various dyes having good lightfastness.

Especially preferred for use herein are dyes, pigments, metal powder and metal compound powder capable of effectively absorbing IR rays falling between 760 nm and 1200 nm.

The dyes may be any known ones, including those available as commercial products and those described in literature (e.g., in *Dye Handbook*, edited by the Organic Synthetic Chemistry Association of Japan, 1970). Concretely, they are azo dyes, metal complexed azo dyes, pyrazolonazo dyes, anthraquinone dyes, phthalocyanine dyes, carbonium dyes, quinonimine dyes, methine dyes, cyanine dyes, metal thiolate complex dyes. Preferred are cyanine dyes as in JP-A Nos. 58-125246, 59-84356, 59-202829, 60-78787; methine dyes as in JP-A Nos. 58-173696, 58-181690, 58-194595; naphthoquinone dyes as in JP-A Nos. 58-112793, 58-224793, 59-48187, 59-73996, 60-52940, 60-63744; squalilium dyes as in JP-A No. 58-112792; and cyanine dyes as in BP434,875.

Also preferred are near IR-absorbing sensitizers as in U.S. Pat. No. 5,156,938; substituted arylbenzo(thio)pyrylium salts as in U.S. Pat. No. 3,881,924; trimethinethiapyrylium salts as in JP-A No. 57-142645 (U.S. Pat. No. 4,327,169); pyrylium compounds as in JP-A Nos. 58-181051, 58-220143, 59-41363, 59-84248, 59-84249,59-146063, 59-146061; cyanine dyes as in JP-A No. 59-216146; pentamethinethiopyrylium salts as in U.S. Pat. No. 4,283,475; and pyrylium compounds as in JP-B Nos. 5-13514, 5-19702.

Still other examples of preferred dyes for use herein are near IR absorbent dyes of (I) and (II) in U.S. Pat. No. 4,756,993.

Of those dyes, especially preferred are cyanine dyes, squarylium dyes, pyrylium salts and nickel-thiolate complexes.

Herein employable are commercial pigments and pigments disclosed in Color Index (C. I.) Handbook, *Most Up-To-Date Pigment Handbook* (edited by the Pigment Technology Association of Japan, 1977), *Most Up-To-Date*

*Pigment Application Technology* (published by CMC, 1986) and *Printing Ink Technology* (published by CMC, 1984).

The dyes employable herein are black pigments, yellow pigments, orange pigments, brown pigments, red pigments, purple pigments, blue pigments, green pigments, fluorescent pigments, metal powder pigments, metal compound powder pigments, and polymer-bonded colorants. More concretely, they include insoluble azo pigments, azo-lake pigments, condensed azo pigments, chelate-azo pigments, phthalocyanine pigments, anthraquinone pigments, perylene and perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. Of those pigments, preferred is carbon black.

The amount of the photo-thermal converting agent of organic compounds that may be used in the thermosensitive layer may be up to 30% by weight of the total solid content of the thermosensitive layer, preferably falling between 5 and 25% by weight, more preferably between 7 and 20% by weight.

On the other hand, it is desirable that the amount of the converting agent of pigments or fine metal particles to be in the thermosensitive layer is at least 10% by weight of the total solid content of the thermosensitive layer in view of the sensitivity of the layer. If too much, however, the agent will have some negative effects on the uniformity and the film properties of the thermosensitive layer. Therefore, the amount of the agent preferably falls between 20 and 70% by weight, more preferably between 30 and 50% by weight.

(Other Additives)

The thermosensitive layer of the planographic printing plate precursor of the invention may optionally contain various known additives generally used in thermosensitive or photosensitive layers of planographic printing plate precursors as long as they do not impair the effect of the invention.

The thermosensitive layer of the invention may contain an image colorant of dye having high absorption in the visible light range, in which the image colorant facilitates differentiation of the image area from the non-image area after image formation. Specific examples of the dye serving as such an image colorant include Oil Yellow #101, Oil Yellow #103, Oil Pink #312, Oil Green BG, Oil Blue BOS, Oil Blue #603, Oil Black BY, Oil Black BS, Oil Black T-505 (all by Orient Chemical Industry), Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), as well as the dyes described in JP-A 62-293247. Also preferred for the image colorant are pigments such as phthalocyanine pigments, azo pigments and titanium oxide.

In case where the image colorant is in the thermosensitive layer, its amount in the layer preferably falls between 0.01 and 10% by weight of the total solid content of the coating liquid for the layer.

In the planographic printing plate precursor of the invention, it is not always necessary to add the photo-thermal converting agent to the thermosensitive layer. The photo-thermal converting agent may be in any layer of the planographic printing plate precursor, as long as the heat generated by its action is utilized in image recording on the precursor. For example, it may be in the hydrophilic surface of the support, or may form a photo-thermal conversion layer by itself or along with any suitable film-forming component.

If desired, the thermosensitive layer of the invention may contain a plasticizer which softens the layer. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate.

The coating liquid for the thermosensitive layer may contain a surfactant which acts for improving the coatability of the liquid. For example, it may contain a fluorine-containing surfactant as in JP-A No. 62-170950. Preferably, the amount of the surfactant to be added falls between 0.01 and 1% by weight, more preferably between 0.05 and 0.5% by weight of the total solid content of the thermosensitive layer.

(Formation of Thermosensitive Layer)

For forming the thermosensitive layer in the invention, the necessary components as above are dispersed or dissolved in a solvent to prepare a coating liquid, and the coating liquid is applied onto the hydrophilic surface of the support. The solvent usable herein includes, for example, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulforane, γ-butyrolactone, toluene, and water, but these are not limitative. These solvents may be used either singly or as combined. The solid concentration of the coating liquid preferably falls between 1 and 50% by weight.

The dry weight (solid content) of the thermosensitive layer formed and dried on the support varies, depending on the use of the printing plate to be obtained herein, but, in general, it preferably falls between 0.5 and 5.0 $g/m^2$. If the dry weight of the layer is smaller than the defined range, the apparent sensitivity of the layer will increase, but the film properties of the layer that acts for image formation therein will worsen.

Various coating methods may be employable for forming the layer. For example, employable is any of bar coating, spin coating, spraying, curtain coating, dipping, air knife coating, blade coating, or roll coating.

[Other Constituent Elements]

(Support)

The support for use herein, which is for forming a hydrophilic surface with hydrophilic graft polymer chains existing therein, is not specifically defined. Any tabular support with good dimensional stability is usable herein, so long as its flexibility, strength and durability are of a desired level. Examples of the support include paper, paper laminated with plastic (e.g., polyethylene terephthalate, polyethylene, polypropylene, polystyrene), metal sheets (e.g., aluminium, zinc, copper), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinylacetal), metal-laminated or deposited paper or plastics as above. In view of their dimensional stability and mechanical strength, preferred for the support for use herein are polyester films and aluminium sheets.

(Surface Profile of Support)

The support for use herein is processed for forming a hydrophilic surface of graft polymer thereon. In view of its processability in forming such a hydrophilic surface thereon and of the adhesiveness of the thus-formed surface and the thermosensitive layer to be formed on the surface, it is desirable that the face of the support to be processed for forming the hydrophilic polymer surface is roughened. Examples of the preferred surface profile (solid surface) of the support for use in the invention are given below.

The condition of the roughened surface of the support for use in the invention is indicated by two-dimensional roughness parameters described in detail hereinunder. Preferably, the support satisfies at least one, more preferably all, of the following requirements of two-dimensional roughness parameters: The center line mean roughness (Ra) falls between 0.1 and 1 μm; the maximum height (Ry) falls between 1 and 10 μm; the 10-point mean roughness (Rz) falls between 1 and 10 μm; the mountain-to-valley mean distance (Sm) falls between 5 and 80 μm; the mountain-to-mountain mean distance (S) falls between 5 and 80 μm; the maximum height (Rt) falls between 1 and 10 μm; the center line of the mountain height (Rp) falls between 1 and 10 μm; and the center line of the valley depth (Rv) falls between 1 and 10 μm.

The two-dimensional roughness parameters are defined as follows:

Center line mean roughness (Ra):

A predetermined length, L, of the roughness curve is sampled in the direction of the center line of the curve, and the absolute values of the deviation of the center line from the roughness curve in the sampled section are arithmetically averaged. The arithmetic average indicates the center line of the mean roughness (Ra).

Maximum height (Ry):

A predetermined length of the roughness curve is sampled in the direction of the mean line of the curve, and the distance between the mountain peak line and the valley bottom line is measured in the direction of the longitudinal magnification of the roughness curve. This indicates the maximum height (Ry)

10-point mean roughness (Rz):

A predetermined length of the roughness curve is sampled in the direction of the mean line of the curve. The height of each mountain in the sampled section and the depth of each valley therein are measured from the mean line in the direction of the longitudinal magnification of the mean line. The average of the absolute values of height (Yp) of the first to fifth highest mountains, and the average of the absolute values of the depth (Yv) of the first to fifth deepest valleys are summed up. The sum of the two indicates the 10-point mean roughness (Rz) in μm.

Mountain-to-valley mean distance (Sm):

A predetermined length of the roughness curve is sampled in the direction of the mean line of the curve. In the sampled section, the length of the mean line that intersects one mountain and that of the mean line that intersects the valley of the neighboring mountain are summed up. All the data of the mountain-to-valley distance thus measured are arithmetically averaged. The arithmetic average indicates the mountain-to-valley mean distance (Sm) in mm.

Mountain-to-mountain mean distance (S):

A predetermined length of the roughness curve is sampled in the direction of the mean line of the curve. In the sampled section, the length of the mean line between the neighboring mountain peaks is measured. All the data of the mountain-to-mountain distance thus measured are arithmetically averaged. The arithmetic average indicates the mountain-to-mountain mean distance (S) in mm.

Maximum height (Rt):

A predetermined length of the roughness curve is sampled. The sampled section is sandwiched between two straight lines both parallel to the center line of the roughness curve, and the distance between the two straight lines is measured. This indicates the maximum height (Rt).

Center line mountain height (Rp):

A predetermined length, L, of the roughness curve is sampled in the direction of the center line of the curve. In the sampled section, a straight line tangent to the highest mountain peak and one parallel to the center line is drawn, and the distance between the straight line and the center line is measured. This indicates the center line mountain height (Rp)

Center line valley depth (Rv):

A predetermined length, L, of the roughness curve is sampled in the direction of the center line of the curve. In the sampled section, a straight line tangent to the deepest valley bottom and parallel to the center line is drawn, and the distance between the straight line and the center line is measured. This indicates the center line valley depth (Rv).

[Plate Making and Printing]

An image is thermally recorded on the planographic printing plate precursor of the invention. Concretely, any means of direct imagewise recording with a thermal recording head, scanning exposure to IR laser, high-intensity flash exposure to xenon discharge lamp or exposure to IR lamp is employable for the image recording. However, preferred is exposure to high-power solid IR laser such as 700–1200 nm IR semiconductor laser or YAG laser.

Thus imagewise exposed, the planographic printing plate precursor of the invention may be directly set in a printer, without requiring any specific development, and any ordinary printing procedure can be carried out to give prints using ink and dampening water. Specifically, the non-exposed area of the exposed planographic printing plate precursor is readily removed by the aqueous component of the dampening water applied thereto, and a non-image area is formed in the initial stage of the printing process.

As in JP No. 2,938,398, the planographic printing plate precursor of the invention may be mounted on a cylinder in a printer, then exposed to laser in the printer, and thereafter developed with dampening water and/or ink in the printer.

Needless-to-say, the planographic printing plate precursor of the invention, after being imagewise exposed, may be developed with a developer such as water or a suitable aqueous solution in an ordinary plate-making process, and the thus-made printing plate may be set in a printer to give prints.

EXAMPLES

The invention is described in detail with reference to the following Examples, which, however, are not intended to restrict the scope of the invention.

[Preparation of Polymer for Use in Thermosensitive Layer]

[Production of Polymer Having a Functional Group Capable of Interacting with Graft Polymer and Having a Functional Group Which Undergoes Changes in Polarity (Production Example 1)]

15.38 g of 1-methoxy-2-propyl styrenesulfonate and 5.84 g of N-triethylammonium methylstyrene were dissolved in 43 g of 1-methoxy-2-propanol, and kept at 65° C. while stirring in nitrogen. To the resulting solution, added was 0.15 g of an initiator, V65 (by Wako Pure Chemicals), and this was stirred for 2 hours. Next, 0.075 g of V65 was further added thereto and stirred for 2 hours, and then 0.037 g of V65 was still further added thereto and stirred for 2 hours. This was cooled and polymer A was thereby obtained. The weight-average molecular weight of the polymer A was measured by GPC and found to be 25000.

[Production of Polymer Having a Functional Group Capable of Interacting with Graft Polymer and Having a Functional Group Which Undergoes Changes in Polarity (Production Example 2)]

Polymer B was produced in the same manner as in Production Example 1 except that 3.5 g of vinylpyridine was used in place of 5.84 g of N-trimethylammonium methylstyrene. The weight-average molecular weight of the polymer B was measured by GPC and found to be 33000.

[Production of Comparative Polymer (Production Example 3)]

A homopolymer of 1-methoxy-2-propyl styrenesulfonate was produced in the same manner as in Production Example 1 except that N-trimethylammonium methylstyrene was not used.

Example 1

[Formation of Hydrophilic Surface]

Using a rod bar #17, the photopolymerizable composition below was applied onto a 0.188 mm-thick PET film (Toyobo; M4100), and dried at 80° C. for 2 minutes. The thus-coated film surface was then exposed to a 400-W high-pressure mercury lamp (Riko Kagaku Sangyo's UVL-400P) for 10 minutes. Then, the film was dipped in an aqueous monomer solution, and then exposed to the 400-W high-pressure mercury lamp in argon for 30 minutes. After being exposed, the film was washed well with ion-exchanged water. Thus, the PET film support having a hydrophilic surface with hydrophilic graft polymer chains existing therein was obtained.

(Photopolymerizable Composition)

| | |
|---|---|
| Allyl methacrylate/methacrylic acid copolymer (80/20 by mol, molecular weight 100,000) | 4 g |
| Ethyleneoxide-modified bisphenol A diacrylate (Toa Gosei; M210) | 4 g |
| 1-Hydroxycyclohexyl phenyl ketone | 1.6 g |
| 1-Methoxy-2-propanol | 16 g |
| [Formation of thermosensitive layer] | |

The hydrophilic surface-having support was immersed for 15 minutes in an aqueous solution of the polymer obtained in Production Example 1 (0.054 monomer moles/liter, in a mixed solvent of water/acetone=1/1), then washed sufficiently with water/acetone (1/1), and dried at room temperature. Thus, a film with a hydrophobic surface was obtained.

Using a spinner, an MFG solution of a photo-thermal converting agent [IR-007 having the structure mentioned below, 3% by weight] was applied onto the film surface at 150 rpm to form a thermosensitive layer thereon. Thus, planographic printing plate precursor 1 was obtained. The 830 nm absorbance of the thermosensitive layer was at least 3.

IR-007

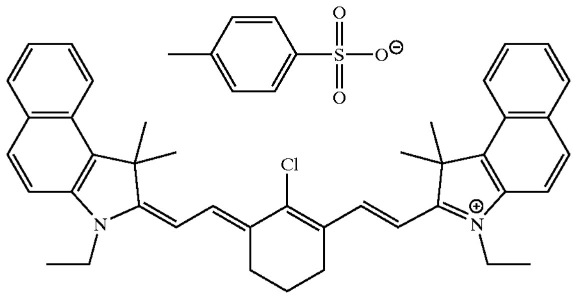

Example 2

Planographic printing plate precursor 2 was fabricated in the same manner as in Example 1 except that a methyl ethyl ketone solution of the polymer (10%) obtained in Production Example 2 was used for forming the thermosensitive layer, in place of the solution of the polymer obtained in Production Example 1, and this was applied onto the support having a hydrophilic surface using a rod bar #7, and dried at 80° C. for 1 minute.

Comparative Example 1

Planographic printing plate precursor 3 was fabricated in the same manner as in Example 1 except that a solution of 5.0 g of the comparative polymer 1 (homopolymer of 1-methoxy-2-propyl styrenesulfonate obtained in Production Example 3) in 45 g of methyl ethyl ketone was used for forming the thermosensitive layer, in place of the solution of the polymer obtained in Production Example 1, and this was applied onto the support having a hydrophilic surface using a rod bar #7, and dried at 80° C. for 1 minute. The 830 nm absorbance of the thermosensitive layer was at least 3.

[Evaluation of Planographic Printing Plate Precursor]

(Press Life)

Each planographic printing plate precursor obtained in the above was exposed with Pearl Setter (830 nm IR laser by Presstek, power 1.2 W, main scanning rate 2 m/sec), and, without post-processing, it was directly set in a printer and tested for printing. The printer used was Ryoubi 3200; the dampening water used was 1/100 diluted solution of EU-3; and the ink used was Ink F Gloss.

In the printing test, all the planographic printing plates tested gave clear 1,000 prints with no stain. The printing test was continued further, and the number of prints which the printing plates gave without the problem of the thermosensitive layer peeling from the support was counted. This indicates the press life of the printing plates tested.

In the continuous printing test, the planographic printing plates of Example 1 (in which the polymer of Production Example 1 was used) and Example 2 (in which the polymer of Production Example 2 was used) of the invention gave 5000 clear prints or more without the thermosensitive layer peeling. This means that the press life of the printing plates of Examples 1 and 2 is at least 5000 prints. On the other hand, the planographic printing plate of Comparative Example 1, in which the comparative polymer of Production Example 3 used does not have a functional group capable of interacting with the graft polymer existing in the surface of the support, become useless after 1500 prints, as the thermosensitive layer peeled off from the support. This means that the press life of the printing plate of Comparative Example 1 is 1500 prints, and it is therefore obvious that the press life thereof is poor.

Next, the planographic printing plate precursors of Examples 1 and 2 of the invention were exposed with Pearl Setter (by Presstek) in the same manner as above except that the 830 nm IR laser power was reduced to 0.6 W. This is half of the laser power, 1.2 W, in the previous test. They were directly set in a printer without being post-processed, and tested in the same manner as above. In this test, the printing plates tested also gave clear prints, like those exposed to the 1.2 W IR laser. This test confirms the high sensitivity of the planographic printing plate precursors of the invention.

From the test results of Examples and Comparative Example, it is understood that the planographic printing plate precursors of the invention always give clear prints, even though they are directly set in a printer and are not developed after exposure. In addition, they are highly sensitive to exposure for image formation thereon, and development in printers is favorable. From the result of the press life test, it is understood that the printing plates of the invention all have long press life.

The advantages of the planographic printing plate precursor of the invention are that its developability in printers is good, its sensitivity is high, and the printing plate has a long press life.

What is claimed is:

1. A planographic printing plate precursor having, on a support having a hydrophilic surface with hydrophilic graft polymer chains existing therein, a thermosensitive layer containing a polymer having, in the molecule, a functional group capable of interacting with the hydrophilic graft polymer and a functional group that undergoes hydrophilicity/hydrophobicity conversion through exposure to heat, acid or radiation.

2. The planographic printing plate precursor as claimed in claim 1, wherein the hydrophilic surface of the support is a surface graft layer of hydrophilic graft polymer chains directly bonded to the surface of the support.

3. The planographic printing plate precursor as claimed in claim 1, wherein the hydrophilic surface of the support is a cross-linked hydrophilic layer having hydrophilic graft polymer chains introduced into the cross-linked polymer film structure.

4. The planographic printing plate precursor as claimed in claim 1, wherein hydrophilic surface of the support the forms a layer having a thickness which falls between 0.001 μm and 10 μm.

5. The planographic printing plate precursor as claimed in claim 1, wherein the interaction between the hydrophilic graft polymer and the polymer of the thermosensitive layer is covalent bonding.

6. The planographic printing plate precursor as claimed in claim 1, wherein the interaction between the hydrophilic graft polymer and the polymer of the thermosensitive layer is ionic bonding.

7. The planographic printing plate precursor as claimed in claim 1, wherein the interaction between the hydrophilic graft polymer and the polymer of the thermosensitive layer is hydrogen bonding.

8. The planographic printing plate precursor as claimed in claim 1, wherein the interaction between the hydrophilic graft polymer and the polymer of the thermosensitive layer is polarity interaction.

9. The planographic printing plate precursor as claimed in claim 1, wherein the interaction between the hydrophilic graft polymer and the polymer of the thermosensitive layer is Van der Waals interaction.

10. The planographic printing plate precursor as claimed in claim 1, wherein the functional group capable of interacting with the hydrophilic graft polymer is a basic functional group.

11. The planographic printing plate precursor as claimed in claim 1, wherein the functional group capable of interacting with the hydrophilic graft polymer is an acidic functional group.

12. The planographic printing plate precursor as claimed in claim 1, wherein the functional group capable of interacting with the hydrophilic graft polymer is a hydrogen-bonding functional group.

13. The planographic printing plate precursor as claimed in claim 1, wherein the functional group that undergoes hydrophilicity/hydrophobicity conversion through exposure to heat, acid or radiation is a functional group which undergoes hydrophobic to hydrophilic conversion.

14. The planographic printing plate precursor as claimed in claim 1, wherein the functional group that undergoes hydrophilicity/hydrophobicity conversion through exposure to heat, acid or radiation is a functional group which undergoes hydrophilic to hydrophobic conversion.

15. The planographic printing plate precursor as claimed in claim 1, wherein the polymer having a functional group which undergoes hydrophobic to hydrophilic conversion is selected from secondary sulfonate polymers, tertiary carboxylate polymers and alkoxyalkyl carboxylate polymers.

16. The planographic printing plate precursor as claimed in claim 1, wherein the thermosensitive layer contains a photo-thermal converting agent.

17. The planographic printing plate precursor as claimed in claim 16, wherein the photo-thermal converting agent is selected from 760–1200 nm IR absorbing dyes, pigments, metal powders and metal compound powders.

18. The planographic printing plate precursor as claimed in claim 1, wherein the thermosensitive layer contains a plasticizer.

19. A method for fabricating a planographic printing plate precursor, which comprises a step of forming, on a support, a hydrophilic surface with hydrophilic graft polymer chains existing therein, and a step of forming, on the support, a thermosensitive layer containing a polymer having, in the molecule, a functional group capable of interacting with the hydrophilic graft polymer and a functional group that undergoes hydrophilicity/hydrophobicity conversion through exposure to heat, acid or radiation.

20. A planographic printing plate precursor having, on a support having a hydrophilic surface with hydrophilic graft polymer chains existing therein, a thermosensitive layer containing a polymer having, in the molecule, a functional group capable of bonding to the hydrophilic graft polymer and a functional group that undergoes hydrophilicity/hydrophobicity conversion through exposure to heat, acid or radiation.

* * * * *